United States Patent
Erdmann

(12) 
(10) Patent No.: US 6,494,134 B2
(45) Date of Patent: Dec. 17, 2002

(54) FRAME FOR FOIL STENCIL AND STENCIL FOIL ASSEMBLY

(76) Inventor: Gunter Erdmann, 18 Ponderosa La., East Walpole, MA (US) 02032

( * ) Notice: Subject to any disclaimer, the term of this patent is extended or adjusted under 35 U.S.C. 154(b) by 0 days.

(21) Appl. No.: 09/836,736

(22) Filed: Apr. 17, 2001

(65) Prior Publication Data

US 2002/0148370 A1 Oct. 17, 2002

(51) Int. Cl.⁷ .......................... B05C 17/08; B41F 15/36
(52) U.S. Cl. .................. 101/127.1; 101/127; 101/128.1
(58) Field of Search .............................. 101/127.1, 127, 101/128.1, 114, 415.1; 38/102, 102.1, 102.3, 102.4, 102.91; 160/371, 378, 382, 390, 404

(56) References Cited

U.S. PATENT DOCUMENTS

| | | | |
|---|---|---|---|
| 4,023,488 A | * 5/1977 | Zimmer | 101/127.1 |
| 5,347,925 A | * 9/1994 | Holderegger | 101/127 |
| 5,622,108 A | * 4/1997 | Benedetto et al. | 101/126 |
| 5,655,445 A | * 8/1997 | Brocker et al. | 101/116 |
| 6,038,969 A | * 3/2000 | Podlipec et al. | 101/127 |
| 2002/0023555 A1 | * 2/2002 | De Laforcade | 101/127.1 |

OTHER PUBLICATIONS

IBM Technical Disclosure Bulletin, vol. 27, Issue 4B, pp. 2381–2382, dated Sep. 1984.*

* cited by examiner

*Primary Examiner*—Leslie J. Evanisko
(74) *Attorney, Agent, or Firm*—Barlow, Josephs & Holmes, Ltd.

(57) ABSTRACT

A stencil foil assembly includes a stencil foil, having a stencil pattern thereon, of a planar configuration secured to a rigid frame with an upstanding wall and a support flange emanating inwardly from the upstanding wall. The stencil foil resides on the support flange with the bottom surface of the periphery of the stencil foil being in communication with the top surface of said support flange. The outer edge of the stencil foil is positioned adjacent to the inner surface of said upstanding wall. The periphery of the stencil foil is secured to the rigid frame. The stencil foil assembly protects a user from injury by preventing contact with the sharp outer edges of the stencil foil. The assembly protects the stencil foil portion from damage and greatly facilitates handling thereof.

15 Claims, 9 Drawing Sheets

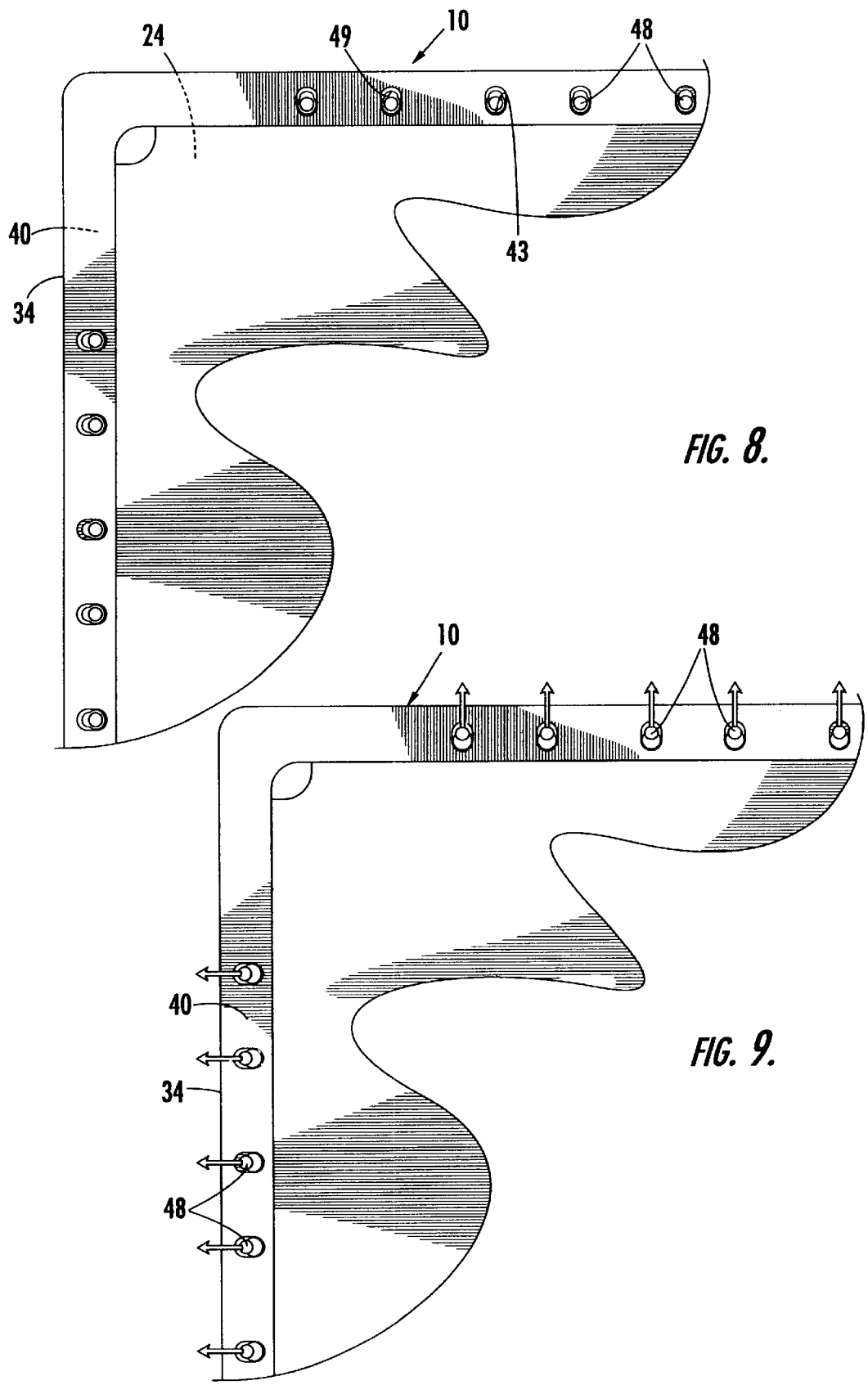

FRAME FOR FOIL STENCIL AND STENCIL FOIL ASSEMBLY

BACKGROUND OF THE INVENTION

The present invention relates generally to the manufacture of circuit boards and pertains, more specifically, to the placement of pads of solder paste in a prescribed pattern on a printed circuit board being prepared for the surface mounting of components onto the circuit board by subsequent soldering.

Current manufacturing techniques for making printed circuit boards call for the mounting of components to the circuit board by "surface mounting". That is, rather than passing the leads of a component through holes in a circuit board and then soldering the leads at the holes, the circuit board is provided with pads of solder paste and the components are placed on the pads for soldering directly to the surface of the board.

In order to place the pads of paste in appropriate locations on the circuit board, just before affixing the components to the board, a stencil-like screen is juxtaposed with the circuit board and provides a pattern of openings registered with the locations where the pads are to be placed. The paste then is spread over the screen with a squeegee to lay down the pattern of pads. The stencil screen is in the form of a thin foil which is supported by a stretcher frame in an appropriately tensioned state. The frame fits into a machine which registers the tensioned screen with the circuit board and then applies the paste. Typically, the machine also stretches the stencil to achieve the desired tension of the stencil to ensure accuracy during printing.

However, the foregoing stencils pose serious safety and operational problems. For example, traditional foil stencils are potential safety hazards to those technicians that handle them due to the presence of sharp edges around the entire periphery of the foil stencil. Such sharp edges can easily cut a person handling the foil stencil and putting them at risk of exposure to infection. This is a particular concern due to the presence of solder-paste, which can be toxic, in the work environment. In light of the aforementioned safety hazards, transportation and storage of foil stencils are problematic because technicians are constantly transporting foil stencils to and from a storage location during the normal course of circuit board manufacture. During this normal handling, the foil stencil undergoes bending, for example, that threatens its integrity. As a result, foil stencils are prone to damage.

There have been many attempts in the prior art to address the foregoing problems with foil stencils relating to safety to the handler and damage during handling and storage. For example, it is common in the prior art to mount foil stencils to an aluminum frame with a polyester border to ensure proper tensioning of the foil stencil. While the encapsulation of the periphery of the foil stencil with polyester keeps the foil tight and covers the sharp edges from the handler, it is time consuming and expensive to encapsulate the foil stencil and requires special molding machinery. As a result, such polyester encapsulated foil stencils require an additional preparation step which typically requires outsourcing to a special subcontractor for such operation. Moreover, these encapsulated foil stencils are difficult to store and cannot be easily retrieved when stacked.

In view of the foregoing, there is a demand for a frame for a foil stencil assembly that protects that handler from the sharp edges to avoid injury. There is a further demand for a foil stencil assembly that can be easily stored and retrieved. There is a demand for a foil stencil assembly that can lay flat or hang from a vertical hook in a high density storage cabinet. There is a further demand for a foil stencil assembly that is inexpensive and easy to assemble without special tools or special equipment. There is also a demand for a foil stencil assembly that has stencil tension that does not decrease over time and is machine washable. In addition, there is a further demand for a foil stencil assembly with a large print area.

SUMMARY OF THE INVENTION

The present invention preserves the advantages of prior art stencil foil assemblies for the surface mount solder paste stencil printing industry. In addition, it provides new advantages not found in currently available assemblies and overcomes many disadvantages of such currently available assemblies.

The invention is generally directed to a stencil foil assembly includes a stencil foil, having a stencil pattern thereon, of a planar configuration. The assembly also includes a rigid frame having a generally L-shaped profile with an upstanding wall and a support flange emanating inwardly from the upstanding wall. The stencil foil resides on the support flange with the bottom surface of the periphery of the stencil foil being in communication with the top surface of said support flange. The outer edge of the stencil foil is positioned adjacent to the inner surface of said upstanding wall. The periphery of the stencil foil is secured to the rigid frame. The stencil foil assembly protects a user from injury by preventing contact with the sharp outer edges of the stencil foil. The assembly protects the stencil foil portion from damage, maintains it in a tensioned condition and greatly facilitates handling thereof.

The stencil foil may be secured to the support flange of the outer rigid frame in a number of different ways. Preferably, a number of studs are provided on the support flange which engage with mounting holes on the stencil foil itself. The mounting holes are, preferably, of a star washer configuration whereby they grippingly engage with the studs on the support flange. For assembly, the outer rigid frame is positioned with the top surface of the support flange facing upwards. The shape of the outer rigid frame and the stencil foil are substantially identical. The stencil foil is positioned over the support flange so that the studs of the support flange align with their corresponding mounting holes. The periphery of the stencil is pushed down onto the support flange to snap the stencil foil into place thereby securing the stencil foil to the outer rigid frame in preparation for handling and subsequent use.

It is therefore an object of the present to provide a stencil foil assembly that protects the user from injury from sharp edges during handling of the foil.

Another object of the present invention is to provide a stencil foil assembly that protects the stencil foil from damage during shipping and handling.

It is a further object of the present invention to provide a stencil foil assembly that is inexpensive and easy to manufacture and assemble.

It is a further object of the present invention to provide a stencil foil assembly that enables a larger printing area than prior art stencil foil assemblies.

It is another object of the present invention to provide a stencil foil assembly that has reduced storage requirements.

A further object of the present invention is to provide a stencil foil assembly that allows shorter manufacturing turn around times.

Yet a further object of the present invention is to provide a stencil foil assembly that eliminates the need to return used frame castings.

Another object of the present invention is to provide a stencil foil assembly that reduces setup time and the need for tools for such setup.

A further object of the present invention is to provide a stencil foil assembly where the stencil tension does not decrease with extensive use.

Another object of the present invention is to provide a stencil foil assembly that is machine washable.

BRIEF DESCRIPTION OF THE DRAWINGS

The novel features which are characteristic of the present invention are set forth in the appended claims. However, the invention's preferred embodiments, together with further objects and attendant advantages, will be best understood by reference to the following detailed description taken in connection with the accompanying drawings in which:

FIG. 8 is a partial top view of the stencil foil assembly of the present invention residing on the stretcher frame prior to stretching;

FIG. 9 is a partial top view of the stencil foil assembly of the present invention residing on the stretcher frame after stretching.

DETAILED DESCRIPTION OF THE PREFERRED EMBODIMENT

Figure 3:
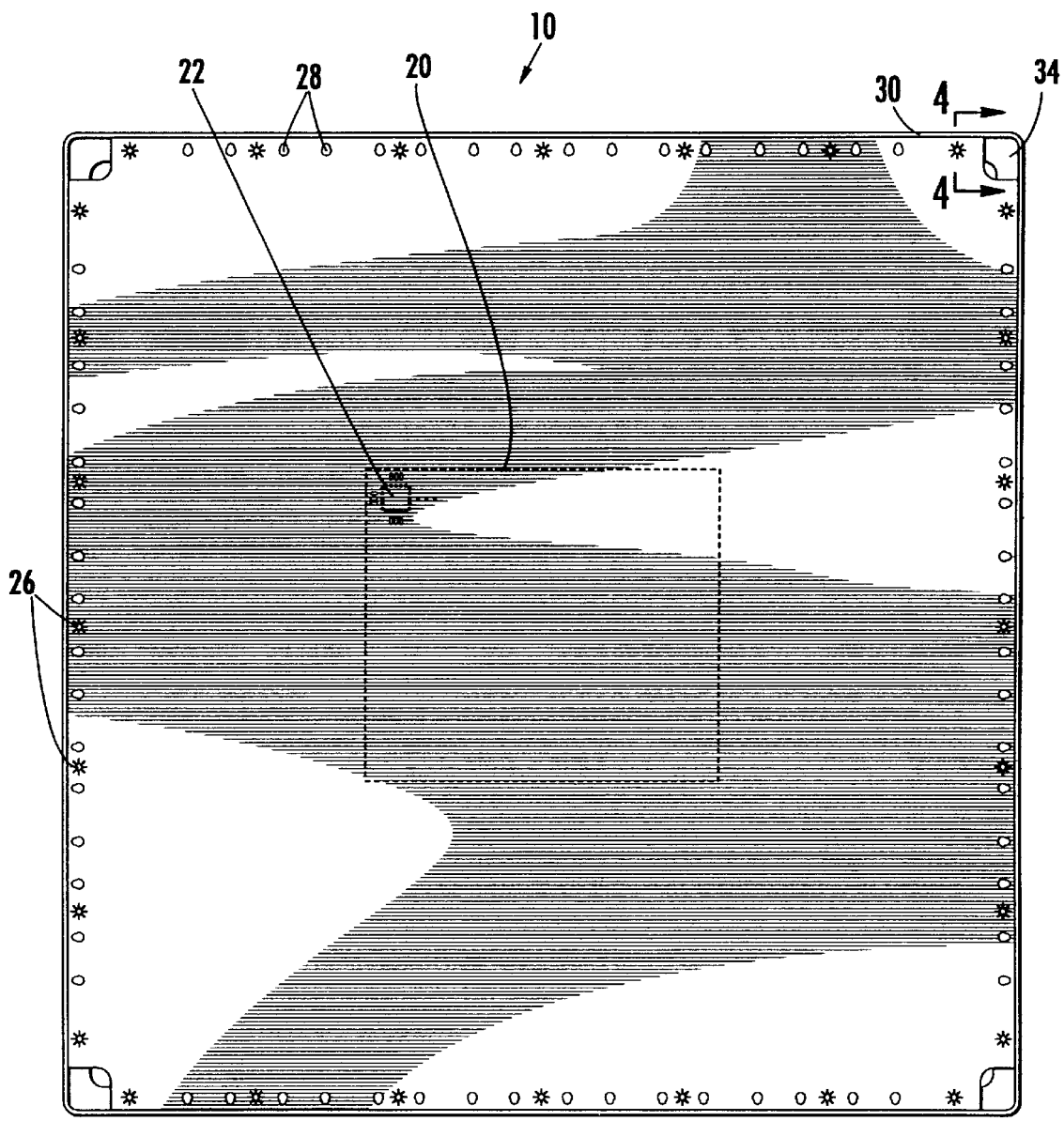
FIG. 3 is a top plan view of the stencil foil of FIG. 1.
Figure 4:
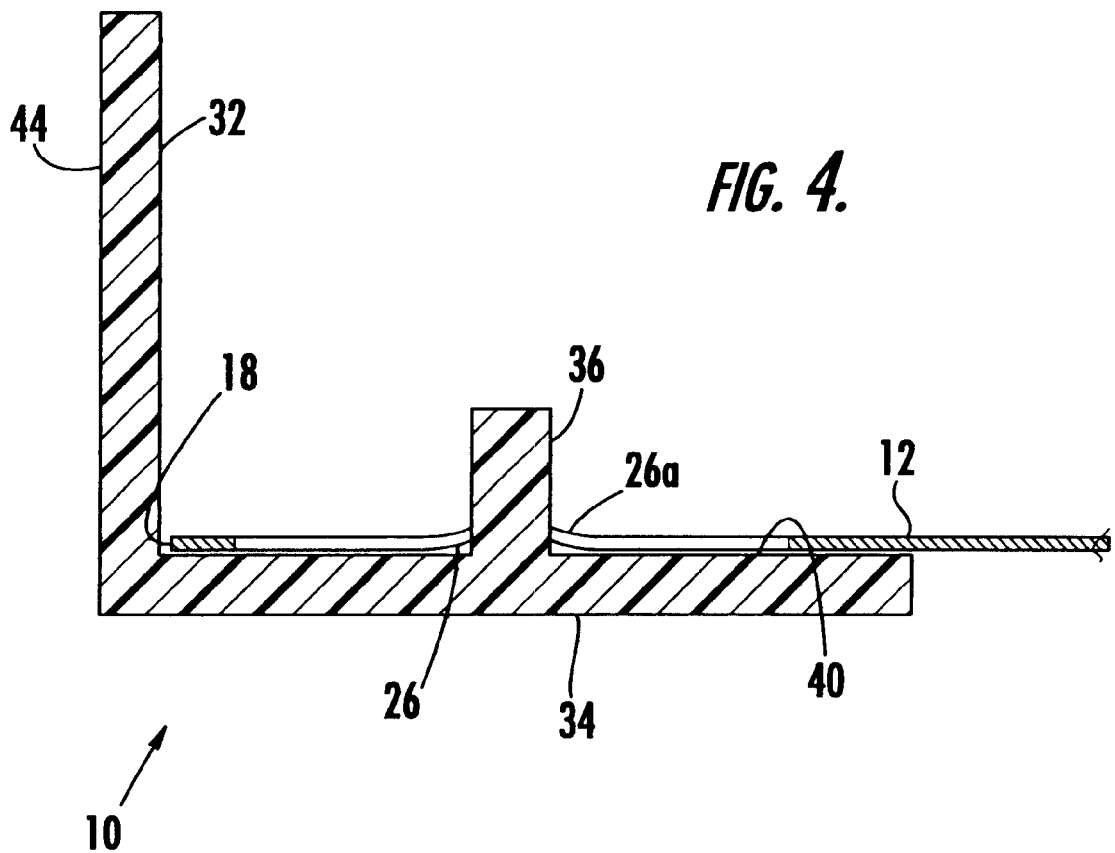
FIG. 4 is a cross-sectional view through the line 4—4 of FIG. 3.
Figure 5:
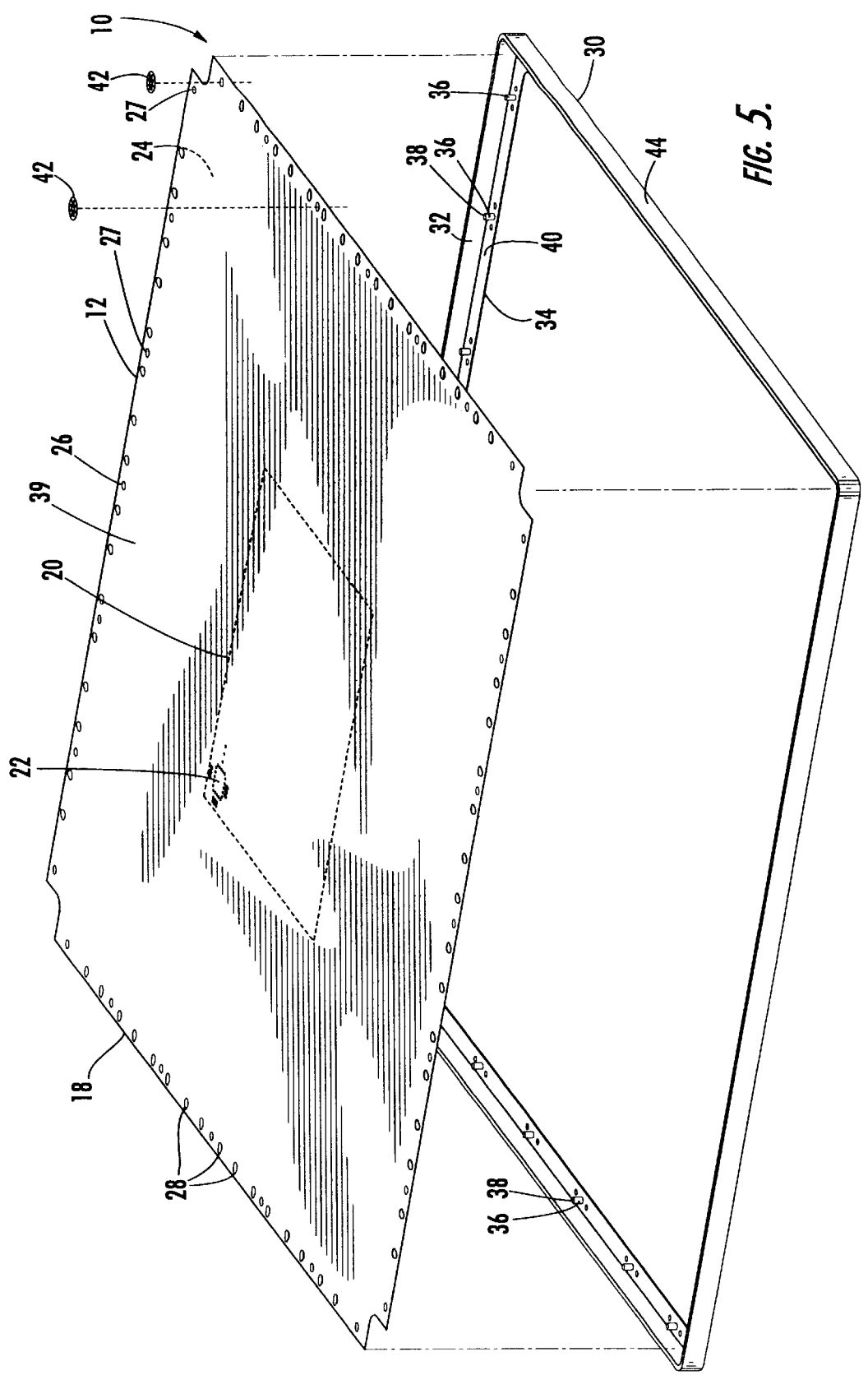
FIG. 5 is an exploded perspective view of an alternative embodiment of the present invention which employs separate star washers.

Referring first to FIGS. 1–4, the foil stencil assembly 10 of the present invention is shown. For illustration purposes only, the foil stencil assembly 10 is shown and described in an orientation where a foil stencil 12 is placed on top of the rigid frame 14. An inverted orientation is also considered within the scope of the present invention. In FIGS. 5–8, the foil stencil assembly 10 is shown in this inverted orientation for installation onto a stretcher frame 16 (as shown in FIG. 5) in preparation for printing.

In FIGS. 1–4, the foil stencil assembly 10 is shown to include a foil stencil 12 with an outer edge 18, a top surface 25 and a bottom surface 24. By way of example, the configuration of the assembly 10 is shown as being square with four sides but it may be of other configurations to suit the application at hand. The foil stencil 12 includes a central region 20 in which an etched circuit board lead pattern 22 resides therethrough. With the assembly 10 in an inverted orientation over a circuit board (not shown), solder paste is drawn across the bottom surface 24 of the foil stencil 12 in the central region 20 and lead pattern 22. Details of the foil stencil printing for circuit boards is so well known in the art, it need not be discussed in detail herein. The foil stencil 12 further includes a number of mounting apertures 26 which are, preferably, in the form of star washers with a circumferential array of gripping fingers as well as registration apertures 28 for installing the assembly on a stretcher frame 16, as will discussed in detail below. The foil stencil 12, as is known in the art, is typically made of brass or stainless steel and is typically in the range of 0.003 to 0.008 inches thick. In accordance with the present invention, a standard foil stencil may be employed to create the foil stencil 12 used in the assembly of the present invention. For example, during the etching process for creating the lead pattern 22 in the central portion 20 of the foil stencil 12, the mounting apertures 26 in the form of star washers and the registration apertures 28 are easily simultaneously created.

An outer frame 30 provides a rigid support for the flexible and delicate foil stencil 12. The outer frame 30 is preferably made of plastic and ideally has a thickness in the approximate range of 70–80 mils. However, other materials and thicknesses may be employed depending on the type of circuit board and foil stencil 12. The outer frame 30 preferably has an L-shaped profile having an upstanding wall 32 and a support flange 34 that emanates inwardly therefrom. Preferably, the support flange 34 emanates from the bottom edge of the upstanding wall 32 and is present about the entire periphery of the upstanding wall 32. However, the support flange 34 may be notched or discontinuous (not shown) to save materials and weight. Further, the profile of the outer frame may be modified to provide proper engagement with a stretcher frame 16 (as shown in FIG. 5) onto which the foil stencil assembly 10 is installed for printing.

Figure 2:
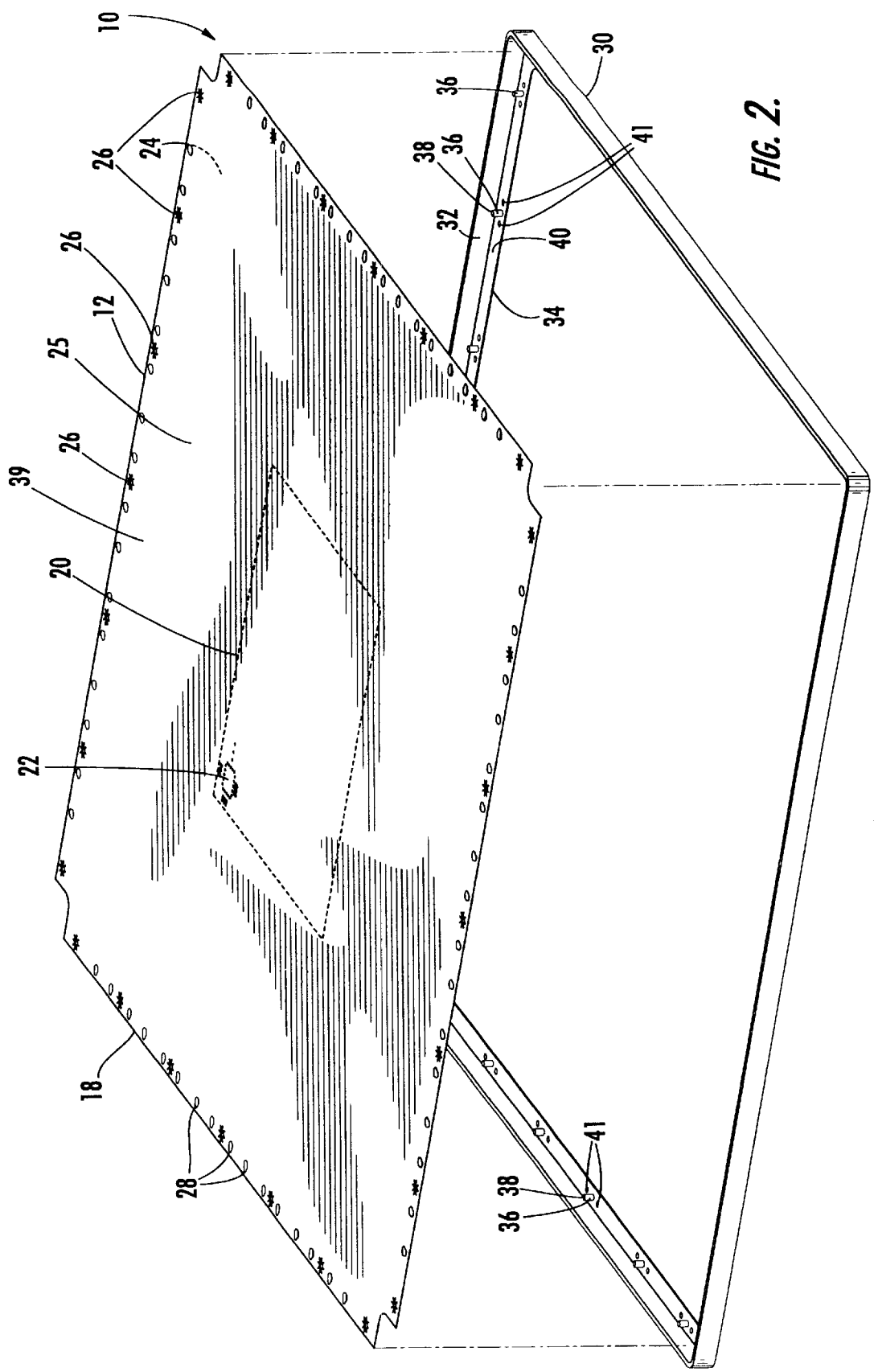
FIG. 2 is an exploded perspective view of the stencil foil assembly of the present invention.

An array of studs 36, each having a free end 38, emanate upwardly from the top surface 40 of the support flange 34. For example, of a total of 28 studs are preferably provided to respectively engage with corresponding mounting apertures 26 through a peripheral region 39 of the foil stencil 12. An number of pass-through apertures 41 are provided through the flange 34 of the outer frame 30. To assemble the foil stencil assembly 10, as best seen in FIG. 2, the foil stencil 12 is placed over the outer frame 30 so that the studs 36 are aligned with the corresponding mounting apertures 26. The foil stencil 12 is then pushed down onto the mounting apertures 26, namely the integral star washers, so that the foil stencil 12 is secured to the outer frame 30. As shown in FIG. 4, installation of the foil stencil 12 to the outer frame 30 causes the FIG. 26a of the star washer of the mounting aperture 26 to grab to the circumference of the stud 36 thereby securing the foil stencil 12 to the outer frame 30. The remaining 27 studs similarly engage their corresponding mounting apertures 26 and associated star washers. When the stencil foil 12 is installed on the outer frame 34, registration apertures 28 of the stencil foil 12 and the pass-through apertures 41 through the outer frames are aligned with one another.

Figure 10:
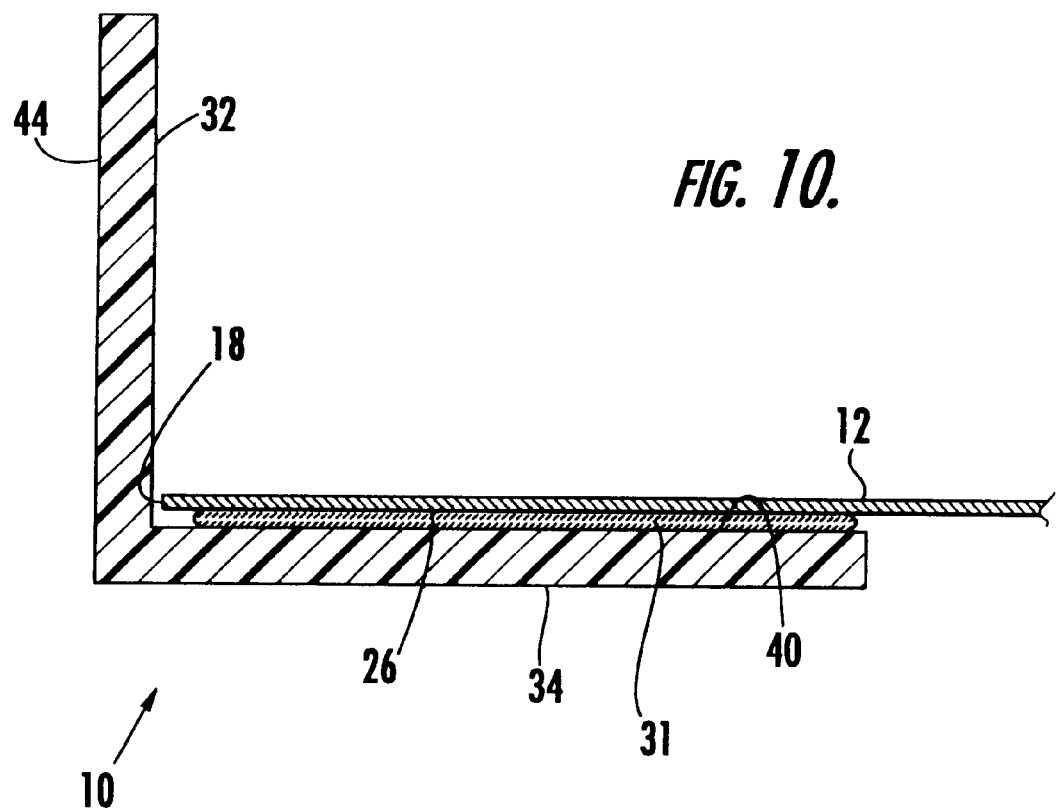
FIG. 10 is a cross-sectional view through the line 4—4 of FIG. 3 with frame attached to stencil by an ultrasonic weld.

Alternatively, as shown in FIG. 5, separate star washers 42 may be employed where the mounting apertures 26 are open pass-through holes to secure the foil stencil 12 to the outer frame 30. In this alternative embodiment, the studs 36 are routed through open mounting apertures 27 to grippingly engage with separate star washers 42. In addition, the foil stencil 12 may secured to the outer frame 30 by ultrasonic welding 31, as shown in FIG. 10. While the use of integrated star washers at apertures 26 through the periphery 39 of the foil stencil 12, the foregoing alternative connection methods are also considered within the scope of the present invention.

Figure 1:
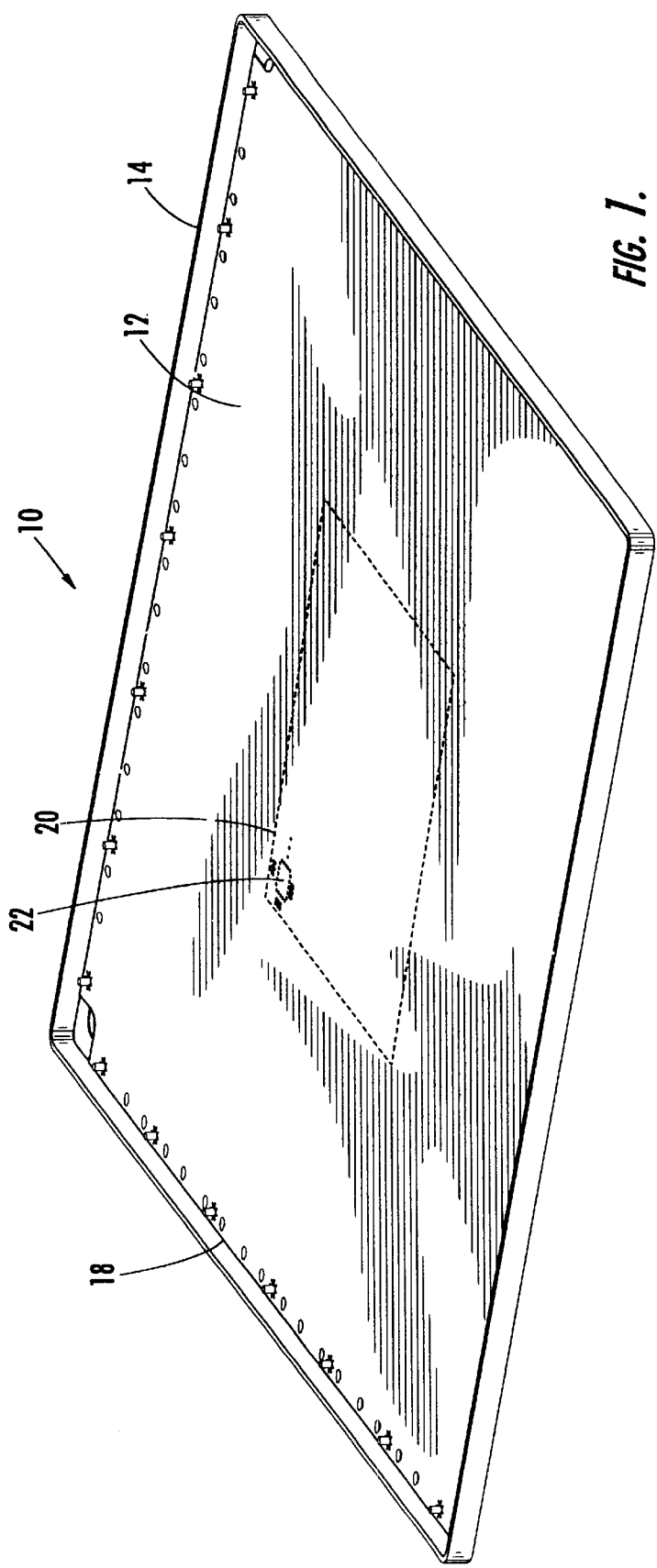
FIG. 1 is perspective view of the stencil foil assembly of the present invention.

Referring to FIG. 4, the sharp outer edge 18 of the foil stencil 12 is embraced by the junction of the upstanding wall 32 and the support flange 34. As a result, a handler of the foil stencil 12 carrying the outer frame 30 is protected by the dangerous sharp outer edge 18. Further, as seen in FIGS. 1–3, a foil stencil 12 is provided that now has a rigid, lightweight frame 30. Such a framed foil stencil or foil stencil assembly 10 is handled with ease by a technician and can be easily stored in a compact fashion. As can be understood, the storage of bare foil stencils 12 is very cumbersome in addition to being dangerous. Searching for the correct foil stencil 12 from a group of stencil fit with an outer frame 30 of the present invention is greatly facilitated because they can be easily labeled on the outer surface 44 of the upstanding wall 32. As a result, the foil stencil assemblies 10 can be pushed into a storage rack requiring only a ½ inch per frame or hung vertically from hooks and still be easily and quickly searched and handled.

Another advantage of the foil stencil assembly 10 of the present invention is the savings in shipping costs. Typically, bare foil stencils 12 are packaged in shipping containers that are much larger than the foil stencil 12 itself to allow for additional packaging to protect the delicate foil stencil 12. Such larger packages incur higher shipping costs. In contrast, a foil stencil 12 configured as the foil stencil assembly 10 of the present invention with outer frame 30, the sharp edges 18 are protected and the foil stencil 12 itself is tensioned and much less susceptible to bending and other damage. Therefore, normal packaging can be used when shipping a foil stencil assembly 10 of the present invention thus avoiding the cost of larger and heavier packaging materials.

The foil stencil assembly 10 of the present invention also has the advantage of being of a standard size and configuration to fit any stencil printer. For example, the frame 30 has a 20 inch by 20 inch dimension with standard registration apertures 28 for accommodating standard screen printer fixtures. Further, the foil stencil assembly 10 of the present invention has a standard 1 inch thick frame 30. In that connection, the foil stencil assembly 10 can be easily and safely cleaned in an ultrasonic cleaner without damage to the foil stencil 12.

Figure 6:
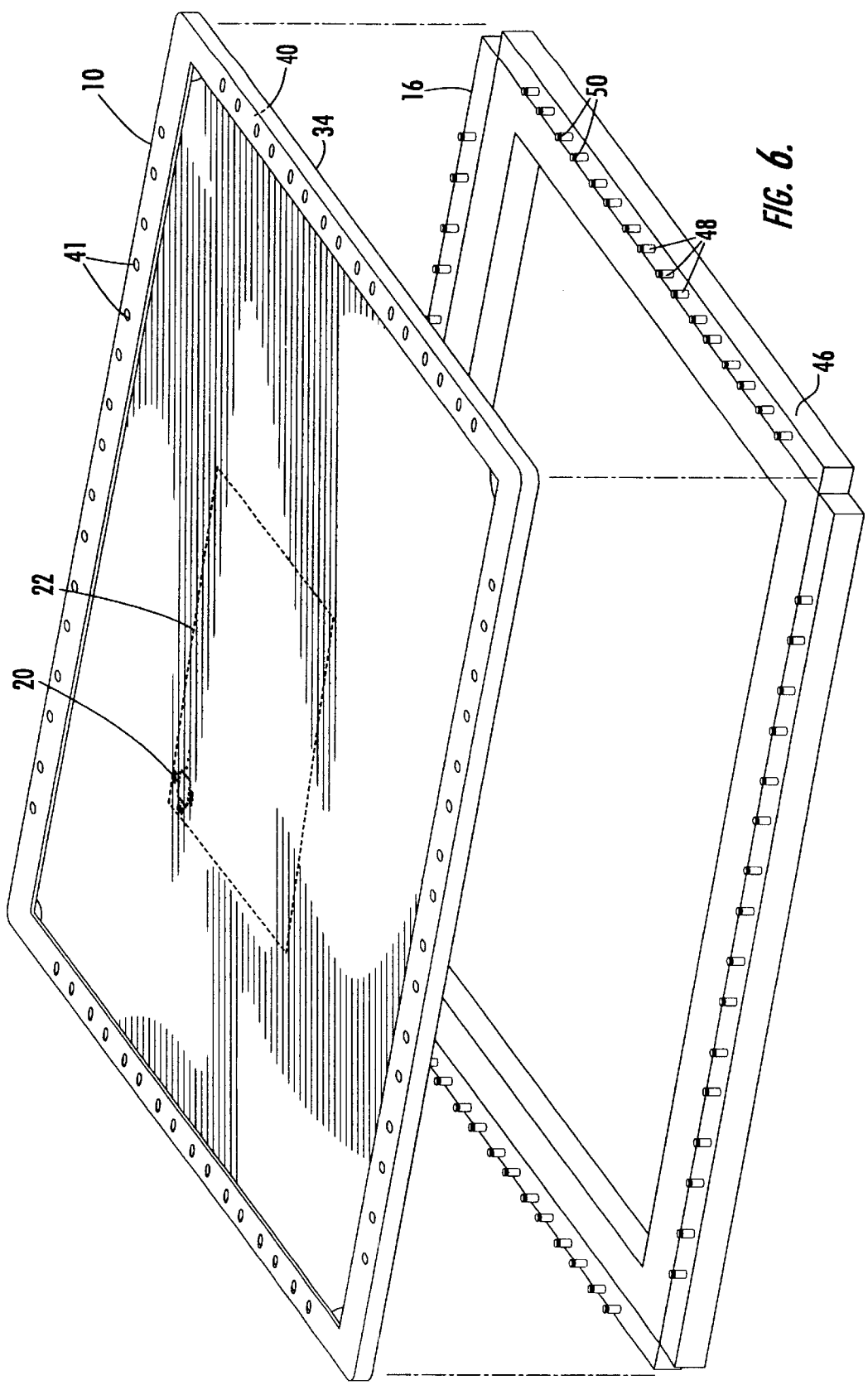
FIG. 6 is a perspective view of the stencil foil assembly of the present invention being installed on a stretcher frame.
Figure 7:
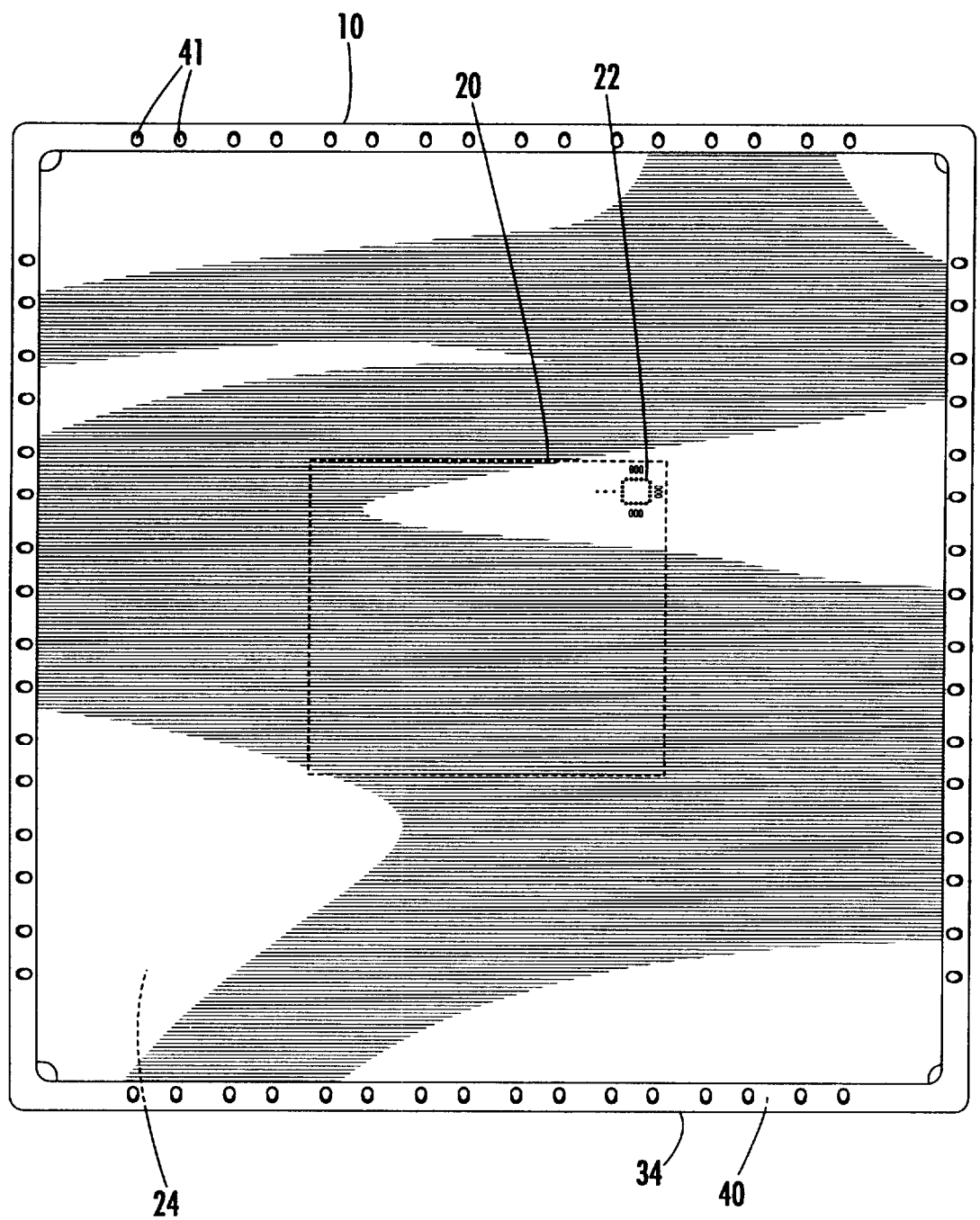
FIG. 7 is a top plan view of the stencil foil assembly of the present invention in preparation for installation onto the stretcher frame.

Unlike prior art foil stencils, the foil stencil assembly 10 of the present invention can be quickly and easily installed on a stretcher frame for printing without fear of injury to the handler. FIGS. 6–9 illustrate the foil stencil assembly 10 of the present invention is installed on a stretcher frame 16. It should be understood that stretcher frame 16 is just one example of many different types of stretcher frames or machines that can accommodate the foil stencil assembly 10 of the present invention. In FIG. 6, an exploded perspective view of the foil stencil assembly 10 in the process of being installed on a stretcher frame 16 is shown. The foil stencil assembly 10 is inverted compared to FIG. 1 so that top surface 40 of the support flange 34 faces toward the stretcher frame 16. A top view of the foil stencil assembly 10, in an inverted position in preparation for installation on the stretcher frame 16, is shown in FIG. 7.

The stretcher frame 16 includes a main body frame 46 with a number of pneumatically spring controlled pins 48 thereon. The registration apertures 28 (not seen in FIG. 6) through the periphery 39 of the foil stencil 12 and pass-through apertures 41 of the outer frame 30 are aligned with the pneumatically controlled pins 48 on the stretcher frame 16. In FIG. 8, the foil stencil assembly 10 is lowered so that the pneumatic pins 48 are routed through the respective registration apertures 28 through the foil stencil assembly 10 and the corresponding pass-through apertures 41 through the outer frame 34. The registration apertures 28, as shown in FIG. 8, each have a preferably oblong shape with a portion with a larger diameter opening 43 and a portion with a smaller diameter opening 49. This permits passage of the head of each of the pins 48 through each of the larger diameter portions 43 of the registration apertures 28 so that the foil stencil assembly 10 can easily rest on the top surface of the stretcher frame 16. The corresponding pass-through apertures 41 through the outer frame 30 are slightly larger than the registration apertures 28 and do not hinder passage of the pins 48 therethrough. In FIG. 9, the pneumatic pins 48 are actuated so that they move in an outward direction as indicated by the arrows. As a result, the reduced neck portion 50 of each pin, as seen in FIG. 6, is received by the smaller diameter opening 49 of the registration apertures 28 of the foil stencil assembly 10. With the pneumatic pins 48 engaged, the foil stencil assembly 10 is secured to the stretcher frame 16 and is stretched in preparation for printing.

In view of the foregoing, the foil stencil assembly 10 of the present invention enjoys significant cost savings when stencils 12 are ordered with the outer frame 30 already installed. Alternatively, circuit board manufacturers, who manufacture their own foil stencils 12, may install the outer frame 30 themselves. Since the outer frame 30 is very low profile, a large print area 20 is available for use and require smaller storage space than prior art foil stencil assemblies. With the foil stencil assembly 10 of the present invention, return of used frame castings is eliminated and setup can be achieved quickly without the need for tools.

It would be appreciated by those skilled in the art that various changes and modifications can be made to the illustrated embodiments without departing from the spirit of the present invention. All such modifications and changes are intended to be covered by the appended claims.

What is claimed is:

1. A frame for holding a stencil foil having exposed edges, comprising:

a rigid frame having an upstanding wall, having a top edge and a bottom edge, and a support flange emanating inwardly from said upstanding wall; said support flange having a top surface and defining a plurality of registration apertures; said top surface providing a support seat for a stencil foil about a peripheral edge of the stencil foil;

a plurality of mounting studs emanating from said top surface of said support flange in a substantially perpendicular direction therefrom; said plurality of mounting studs engageable with a peripheral portion of a stencil foil; and whereby a stencil foil installed in said rigid frame is maintained in a flat arrangement with exposed edges of a stencil foil being protected from a user.

2. The frame of claim 1, wherein said rigid frame and said plurality of mounting studs are integrally connected to one another.

3. The frame of claim 1, wherein said rigid frame and said plurality of mounting studs are made of plastic.

4. The frame of claim 1, wherein said plurality of mounting studs are spaced apart from one another on said top surface of said support flange.

5. The frame of claim 1, wherein said rigid frame is of a square configuration.

6. The frame of claim 1, wherein said rigid frame is of a rectangular configuration.

7. A stencil foil assembly, comprising:
a stencil foil of a planar configuration having a top surface, a bottom surface and outer edge with a central region and a peripheral region proximal to said outer edge; said central region including a stencil pattern therethrough;
a rigid frame having an upstanding wall, having an inner surface, top edge, a bottom edge, and a support flange emanating inwardly from said upstanding wall; said support flange having a top surface; said stencil foil residing on said support flange with said bottom surface of said peripheral region of said stencil foil being in communication with said top surface of said support flange; said outer edge of said stencil foil being adjacent to said inner surface of said upstanding wall; said stencil foil defining a plurality of registration apertures through said peripheral region of said stencil foil and said support flange defining a plurality of pass-through holes respectively corresponding to said registration apertures; and
means for securing said stencil foil to said rigid frame.

8. The stencil foil assembly of claim 7, wherein said means for securing said stencil foil to said rigid frame is an ultrasonic weld.

9. The stencil foil assembly of claim 7, wherein said means for securing said stencil foil to said rigid frame is a plurality of mounting apertures through said peripheral region of said stencil foil and a plurality of mounting studs, having free ends, emanating from said top surface of said support flange in a substantially perpendicular direction therefrom; said plurality of mounting studs being routable through said mounting apertures in said peripheral region of said stencil foil.

10. The stencil foil assembly of claim 9, wherein said mounting apertures are of a star washer configuration.

11. The stencil foil assembly of claim 9, further comprising:
a plurality of star washers respectively engageable with said free ends of said mounting studs.

12. The stencil foil assembly of claim 7, wherein said rigid frame is made of plastic.

13. The stencil foil assembly of claim 12, wherein said rigid frame has an approximate thickness in the range of 70 to 80 mils.

14. The stencil foil assembly of claim 7, wherein said rigid frame and said stencil foil are of a square configuration.

15. The stencil foil assembly of claim 7, wherein said stencil foil is made of metal.

* * * * *